United States Patent [19]

Bhargava et al.

[11] Patent Number: 4,855,873
[45] Date of Patent: Aug. 8, 1989

[54] STANDOFF AND GROUNDING CLIP ASSEMBLY

[75] Inventors: Vikram Bhargava, Alpharetta; James R. Heberling, Lawrenceville, both of Ga.

[73] Assignee: Hayes Microcomputer Products, Inc., Norcross, Ga.

[21] Appl. No.: 202,111

[22] Filed: Jun. 3, 1988

[51] Int. Cl.$^4$ .................. H05K 9/00; H05K 7/14; F16B 19/00; H01R 4/26

[52] U.S. Cl. ................ 361/424; 174/138 D; 361/415; 411/508; 439/92; 439/444

[58] Field of Search .......... 174/35 R, 35 GC, 35 MS, 174/51, 138 D; 361/380, 391, 394, 395, 399, 403, 412, 415, 417, 418, 419, 420, 422, 424; 24/453; 411/500, 501, 508, 907, 908; 439/92, 95, 444, 816, 862

[56] References Cited

U.S. PATENT DOCUMENTS

| D. 291,278 | 8/1987 | Hill | 174/138 D X |
|---|---|---|---|
| 2,442,754 | 6/1948 | Beam | 411/500 X |
| 4,063,788 | 12/1977 | Latasiewicz et al. | 361/395 X |
| 4,585,902 | 4/1986 | Munroe | 174/87 |
| 4,713,633 | 12/1987 | Okawa et al. | 361/424 X |

FOREIGN PATENT DOCUMENTS

| 3335664 | 4/1985 | Fed. Rep. of Germany | 174/35 R |
|---|---|---|---|
| 766052 | 9/1980 | U.S.S.R. | 361/395 |

OTHER PUBLICATIONS

Wang, J. P., "Straight Molded Locking Post", *IBM Technical Disclosure Bulletin*, vol. 24, No. 7B, Dec. 1981, pp. 3923 and 3924.

Primary Examiner—Laramie E. Askin
Attorney, Agent, or Firm—Jones, Askew & Lunsford

[57] ABSTRACT

An improved standoff for use in assembly of an electronics device includes a generally cylindrical body with a bore hole through the longitudinal axis. A plurality of reinforcing fin-shaped members disposed radially about the outer surface provide additional rigidity to the structure as well as providing surfaces at each end of the standoff upon which circuit boards may rest. A plurality of clips may be moved under compression and passed through holes on a circuit board. Once they have passed through, they will elastically return to their normal position thus loosely, but securely, holding the circuit boards together. This allows the standoffs to hold the circuit boards together, without the use of additional nuts and bolts and conventional spacers, and also allows the passing of final assembly screws through the longitudinally bore of the spacer. An electrically conductive stamped metal spring clip is provided over a mounting post and serves the dual function of providing electrical contact between grounded conductors on a circuit board and the equipment enclosure, as well as providing a spring to compensate for mechanical tolerances and to assure the application of sufficient stress to an assembly screw to maintain the apparatus in a dependable assembly state irrespective of subsequent stress relaxation in any plastic components.

12 Claims, 4 Drawing Sheets

STANDOFF AND GROUNDING CLIP ASSEMBLY

TECHNICAL FIELD

The present invention relates to devices for the mechanical assembly of electronic equipment using standoffs or spacers to establish predetermined spacings between components, and in particular circuit boards or circuit boards and enclosures, in the construction of electronic equipment. In particular the present invention is an improved construction for a standoff, and spring and grounding clip, particularly useful in the construction of electronic equipment requiring multiple circuit boards to be assembled within an enclosure wherein the circuit boards, and other associated electronics, are assembled as a module which may be easily inserted into and removed from the enclosure.

The present invention particularly relates to assembly of electronic equipment which requires significant suppression of free space emissions of radio frequency interference from the device.

BACKGROUND OF THE INVENTION

The use of spacers or standoffs in construction of electronic gear is well known. Typically, such standoffs are made of metal, nylon, or some other plastic material and are cylindrical in external shape and annular in cross sections perpendicular to their longitudinal axes. They provide a convenient way of providing predetermined spaces between mechanical elements and an electronic assembly. For example, it is common to use spacers to set the soldered side of a circuit board away from a metal equipment enclosure by at least a predetermined distance to avoid shorting of soldered contacts on the circuit board to or through the enclosure. Additionally, standoffs help provide required minimum spacings to allow adequate air flow through electronic devices housed in typical equipment enclosures to allow adequate heat dissipation for active components of the circuit.

The need for the present invention arose in connection with a need to assemble a piece of electronic equipment in a manner in which all of the electronics of the main body of the unit, i.e., all but those associated with a front panel connected through a plug and ribbon cable, were to be assembled in a subassembly which could be quickly dropped into and attached to an equipment enclosure. While the present invention has utility in the construction of many devices, the environment which led to the need for same was the construction of a 9600 bit per second modem implementing Recommendation V.32 of the CCITT. Such devices are relatively complex and normally include a large number of components, due primarily to the stringent digital signal processing requirements of same. The particular application was one which required two circuit boards to be assembled one over the other and spaced apart a predetermined distance.

As is well known to those skilled in the art, circuit board "real estate" is a precious commodity in the modern world of construction of physically attractive, commercially practical electronic apparatus. This is particularly true in connection with computer peripheral devices which are experiencing a drive toward miniaturization which is both technically driven (i.e., more miniaturization is possible) and market driven, in that customers are demanding greater functionality out of increasingly diminutive boxes.

Anyone who has disassembled a piece of electronic equipment of any complexity is quite familiar with the common phenomenon of lost screws, spacers, and lock washers, and the sudden collapse of the structure due to everything finally giving away at once as the device is disconnected from the enclosure and the enclosure is opened. While this rarely creates problems of reassembly for the skilled technician familiar with the product, it, of necessity, leads to products that are more difficult and time consuming to assemble at the point of initial manufacture.

For example, if a device employing a pair of circuit boards, one over the other, is to be assembled using conventional spacers where a common screw is passed through aligned holes in the circuit boards, a conventional spacer separating same, and one hole of at least one side of the equipment enclosure, the following steps are required as a practical matter. The screw must first be inserted through the panel of the equipment enclosure nearest the head of the screw. Assume for a moment that this is the bottom portion of the equipment enclosure. First, any spacer or standoff necessary to keep the bottom of the lower circuit board off the enclosure must be dropped over the shank of the screw. Next, the lower circuit board must be put in place, followed by a standoff, followed by the upper circuit board, which in turn is followed by any standoffs or other devices used to keep the upper circuit board from sliding along the screw, or contacting the upper portion of the enclosure. Typically, the upper portion of the equipment enclosure is then placed over the entire assembly and it is inverted in order to rotate the screw to get its threads to engage a threaded and mating hole connected to the upper portion of the enclosure. Those familiar with this process will quickly appreciate that if one of the screws becomes dislodged during the process of lifting and inverting, it will often fall out of the enclosure leading to a situation in which the spacers which were journaled around the screw being quickly scattered about the enclosure, and the process must be repeated. Naturally, the same conditions prevail during disassembly for purposes of repair or the like.

Personnel of applicants' assignee, including the present inventors, set out to design apparatus for assembling an electronic product using at least two circuit boards which would overcome these problems with the prior art and make the final assembly process quicker and more reliable. Additionally, it was desired to provide a set of assembly components, and a method of assembly which would keep the main module of the electronic device intact when the enclosure was removed and minimize the time required to reassemble the entire product back into the enclosure.

Additionally, in the environment of the preferred embodiment, the assembly is finally put together by passing a screw through one panel of the equipment enclosure, a standoff integrally formed with the panel, both circuit boards and the standoff of the present invention, and onto a threaded female member embedded in the other panel of the enclosure. This screw is ultimately tightened with significant force so that the two opposing sections of the equipment enclosure squeeze the balance of the assembly and place the standoff under a significant amount of stress. Part of the stress results from the use of the novel and improved grounding and tolerance correction clip of the present invention.

Additionally, it is known to those skilled in the art that there is a strong need for good design techniques which will prevent the free space radiation of radio frequency interference from modern electronic devices. This is particularly true with respect to computer peripheral devices, such as modems, which use significant amounts of high speed digital circuitry in the construction thereof. In the United States of America, there are stringent legal requirements in the form of upper limits on free space radio frequency emission allowable from computer peripheral devices over specified bandwidths which must be met before the product can be legally sold in the U.S.A.

Part of the basics of good RFI suppression design practice for computer peripherals includes the use of wide foil areas of grounded conductors around the periphery of circuit boards. It is highly desirable to provide good secure ground connections between these areas and a case ground electrical point, normally manifesting itself as electrically conductive shielding material disposed on the interior of the enclosure for the equipment. In other cases, the shielding effect of the case is accomplished by making all or the substantial majority of the case from electrically conductive material.

A portion of the present invention constitutes an improved grounding and spring clip which serves dual functions of providing a dependable ground connection between grounded conductors on the periphery of a circuit board and compensating for various accumulated mechanical tolerances in the assembly of the final device. The use of this clip, under certain tolerance conditions, can lead to significant stress on the standoff.

The net result is that the standoff of the present invention is subject to a significant stress in the form of being longitudinally compressed in the final assembly. In the environment in which the present invention is used, a fairly wide range of stresses must be tolerated by the standoff in order to accomplish the goal of a tight and dependable final assembly with a particular sized reveal being provided at the mating edges of the two sections of the equipment enclosure.

The inventors of the present invention discovered that conventionally available standoffs tended to deflect radially, or bow, under some of the longitudinal compressions reqired to make the final assembly, depending on the necessary compression to provide the proper reveal which is a function of the cumulative tolerance of the thicknesses of the circuit boards, and the height of the standoffs formed integrally with the enclosure panels.

Additionally, it was desired to provide a standoff which would serve the function of holding two or more circuit boards together in a single subassembly when the screws passing through the standoffs are removed and one of the boards is removed from the enclosure.

There is also a need in the art for a clip device which will serve multiple functions within an electronic assembly. In particular, it is desirable to have a clip device which can provide good ground connections on one or more circuit boards used in an assembly. It is additionally preferable to have the same device be able to compensate for the variations in manufacturing size of components, within specified tolerance range, including the thickness of circuit boards, the length of the shank area of the standoff of the present invention, and certain spacings within the equipment enclosure itself.

Furthermore, in prior art devices using plastic enclosures and/or standoffs, through which the mechanical assembly bolts holding the entire apparatus together pass, the phenomenon of stress relaxation has been observed. Stress relaxation is a phenomenon of plastic materials which occurs when they are put under a stress load for long periods of time. If, for example, an elongated machine screw and nut are used to tighten an electronic assembly through a plastic enclosure and plastic standoffs, it will be found, after passage of a certain period of time, that the mechanical stress intially generated by the tightening of the screw will have relaxed. This may lead to a loosening of components within the equipment which can ultimately lead to the machine screw and bolt becoming separated or a generally loose feeling about the equipment. This can lead customers to believe that same is shoddily manufactured, when in fact, the apparatus is properly made and the unavoidable mechanical phenomenon of stress relaxation is simply manifesting itself.

SUMMARY OF THE INVENTION

The present invention provides the above needed functions in an improved standoff and grounding clip assembly. Broadly stated, the standoff of the present invention comprises a rigid cylindrical body which is hollow through its longitudinal axis. At least three, and preferably four, radially extending reinforcing members provide additional rigidity to the structure which prevents same from bowing under compression. The upper and lower ends of the radial extending fins terminate in respective common planes which provide a support surface for holding a pair of circuit boards in spaced apart relationship so that the surfaces of the circuit boards contacting the fin reinforcing members in the respective planes are held a predetermined distance apart.

Extending above the plane formed by the ends of the reinforcing members are a plurality of elongated clips which may be moved toward the longitudinal axis of the standoff in order to allow them to pass through a hole of predetermined size. When the clips have passed through the hole, they will resiliently return to their normal positions and will thus hold the circuit board in place.

Conceptually, the standoff of the present invention may be accomplished by providing a land area which is simply the terminating end of the shank. The only critical relationship between this and the elongated clips is that the elongated clips, in their stressed positions toward the longitudinal axis, lie radially inward of the periphery of the land area. This allows the clips to serve the function of retaining a circuit board connected to the standoff (when the clips are passed through a hole on the circuit board) and yet will cause the circuit board to seat on the land area without sliding down the shank due to an oversized hole on the circuit board. Therefore, the preferred form of the present invention is to use the reinforcing fins described hereinabove and to dispose these so that they are aligned, parallel to the longitudinal axis of the shank, with inter-clip spaces. This allows the standoff of the present invention to be constructed using injection molding techniques.

Provision of the clips at both ends provides an arrangement which will keep an electronic subassembly comprising the two circuit boards held together so that it may all be lifted out, without regard to holding any screws or similar devices in place when the entire electronic device in question is disassembled.

The grounding and spring clip of the present invention is preferably constructed to be easily formed from stamped metal. In its preferred form, it includes a substantially planar surface with a hole therethrough for allowing the ends of the flexible spring slips from the standoff of the present invention to freely pass therethrough. A plurality of upwardly pointing legs are formed from tabs of the stamped metal which are bent approximately 90 degrees. In the preferred form, at least two of these have biting surfaces punched out of the legs so that, when the legs are inserted over a post, the biting surfaces will score and grip into the post if any attempt is made to withdraw them. A plurality of downwardly pointing leaf springs, preferably one disposed at each corner, provide the mechanical spring functions to give the following advantages. First, the use of the leaf springs allows the assembly screws to be tightened to a desired degree to assure the ultimate desired spacing between halves of the equipment enclosure. As noted hereinabove, in the environment which gave rise to the present invention, it was desired to have the upper and lower sections of the equipment enclosure closed to a point where a reveal of small and constant predetermined width was provided about the periphery of the equipment enclosure.

The leaf spring's at-rest position is chosen so that even when all of the components sandwiched in the assembly are of minimum thickness, sufficient spring tightening will be required to cause the springs to push against the clip and the circuit board which they contact. This provides a spring loaded stress along the longitudinal axis of the assembly screw. The leaf spring, under such stress, will tend to compensate for the stress relaxation in the plastic standoff. Thus, the necessary stress to hold the final assembly tightly together will be reliably provided for a number of years.

Secondly, the leaf springs are electrically conductive and electrically connected to the aforementioned downwardly pointing legs of the clip. In the preferred embodiment, the circuit boards used have exposed foil areas on a grounding strip around the periphery of the boards and this strip is contacted by the leaf springs. The clip electrically ties these ground areas to the legs of the clip, which in turn score a mounting post connected to the equipment enclosure. In the preferred embodiment, the posts are made of plastic and the entire interior of the case is sprayed with copper containing conductive paint to provide RFI suppression shielding. This causes the entire combination to provide dependable ground connections, at each location where one of the clips of the present invention is used, to the shielding conductive material of the case ground in order to assist in providing good free space RFI emission suppression.

In the preferred embodiment of the present invention, the hole within the middle of the clip, and a recessed area at the end of the mounting post connected to the equipment enclosure, are sized so that the flexible clips of the standoff of the present invention may easily fit within same in a non-journaled relationship under all practical ranges of compression of the leaf springs. This eliminates the need to maintain the length of the flexible clips on the standoff to close mechanical tolerances. It further means that the net space in between the interior portions of the equipment enclosure are functions only of the tolerances of the lengths of the mounting posts and the reinforcing members of the standoff, together with the thicknesses of the circuit boards. Screws passing longitudinally through the entire assembly are tightened until the upper and lower portions of the equipment enclosure are a desired distance apart. The leaf springs on the clips described hereinabove take up any slack and allow the halves of the enclosure to be moved to the desired distance apart even if all of the above noted tolerances err toward maximum length and thickness.

Thus, it will be understood that it is an object of the present invention to provide an improved standoff having greater rigidity than that in the prior art for holding a pair of circuit boards in spaced apart relationship.

It is a further object of the present invention to provide such a standoff with apparatus for retaining circuit boards connected to each end thereof in fixed relative positions even when no screws passing through the longitudinal bore of the standoff are present. Thus, the standoff may be used to construct a subassembly which will hold together during subsequent handling before the process of final assembly.

It is still a further object of the present invention to provide an improved grounding and spring clip which provides a dependable connection between a grounded conductor at the periphery of a circuit board and case ground in an equipment enclosure.

It is still a further object of the present invention to provide an improved grounding clip which will accomplish this function for electronic devices employing multiple circuit boards disposed one over the other.

It is still a further object of the present invention to provide an improved grounding and spring clip which provides the above referenced dependable ground connection and at the same time compensates for all mechanical tolerances to assume that, when all tolerances are minimum, suffcient stress will still be applied to solidly connect the overall assembly and overcome any problems of stress relaxation in the plastic components. At the same time, the present invention allows sufficient travel in the spring of the clip so that the apparatus may be assembled to its proper overall dimensions even when all tolerances err to their maximum thickness and length.

It is still a further object of the present invention to provide apparatus for use in the assembly of electronic devices which minimizes the portions of circuit board real estate occupied by mechanical connectors and case ground connectors and still allows the designer to utilize the best design techniques of RFI emissions suppression.

DETAILED DESCRIPTION

Figure 1:
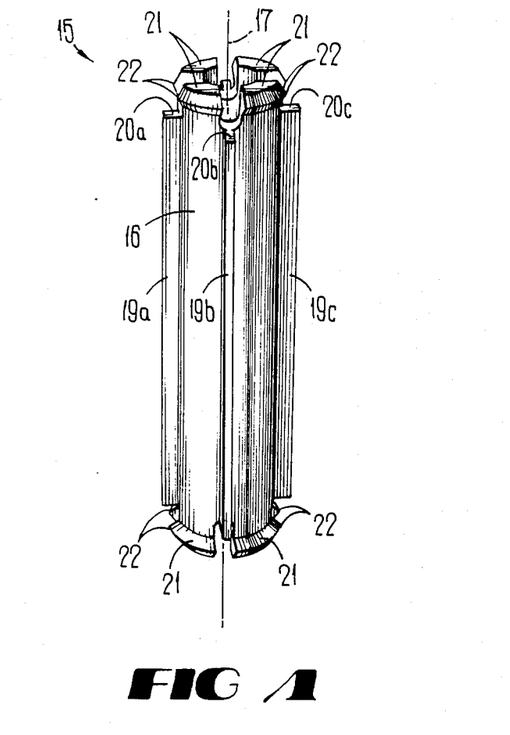
FIG. 1 is a pictorial view of the preferred embodiment of the standoff of the present invention.

Turning now to the drawing figures in which like numerals represent like parts, the preferred embodiment of the present invention will now be described. The improved standoff 15 of the preferred embodiment is shown in FIG. 1. Therein it may be seen that the preferred embodiment is an elongated cylindrical body 16 having an outer surface. The standoff has a bore of circular cross section all the way through the body along longitudinal axis 17. A plurality of fin-like reinforcing members 19a through 19c extend parallel to the longitudinal axis. It should be understood that, in the preferred embodiment, there are four of said reinforcing members spaced at equal 90 degree increments around the outer surface of the body 16. The upper ends of reinforcing members 19a through 19c terminates in one of respective end surfaces 20a through 20c. The end surface of the rear reinforcing member also terminates in the same plane. A plurality of clips 21 extend up from the top and down from the bottom of body 16. Each clip is characterized by a beveled edge 22 which grabs a circuit board (not shown in FIG. 1) when clips 21 are passed through a hole in the board. It should be noted that beveled edges 22 of clips 21 are fashioned so that they encompass a diameter about longitudinal axis 17 which is greater than the diameter of the cylindrical body 16. This assures that when the clips relax to their normal position, as shown in FIG. 1, the beveled surfaces 22 will extend out over the surface of the board through which the clips were pushed.

The fin-shaped reinforcing members serve a dual function in the preferred embodiment of providing additional rigidity to the spacer as well as providing upper and lower resting surfaces for a respective pair of circuit boards.

The improved standoff of the present invention may be made of the same materials that conventional standoffs are made of, such as metal or plastic, but is preferably made of 6—6 nylon.

Figure 2:
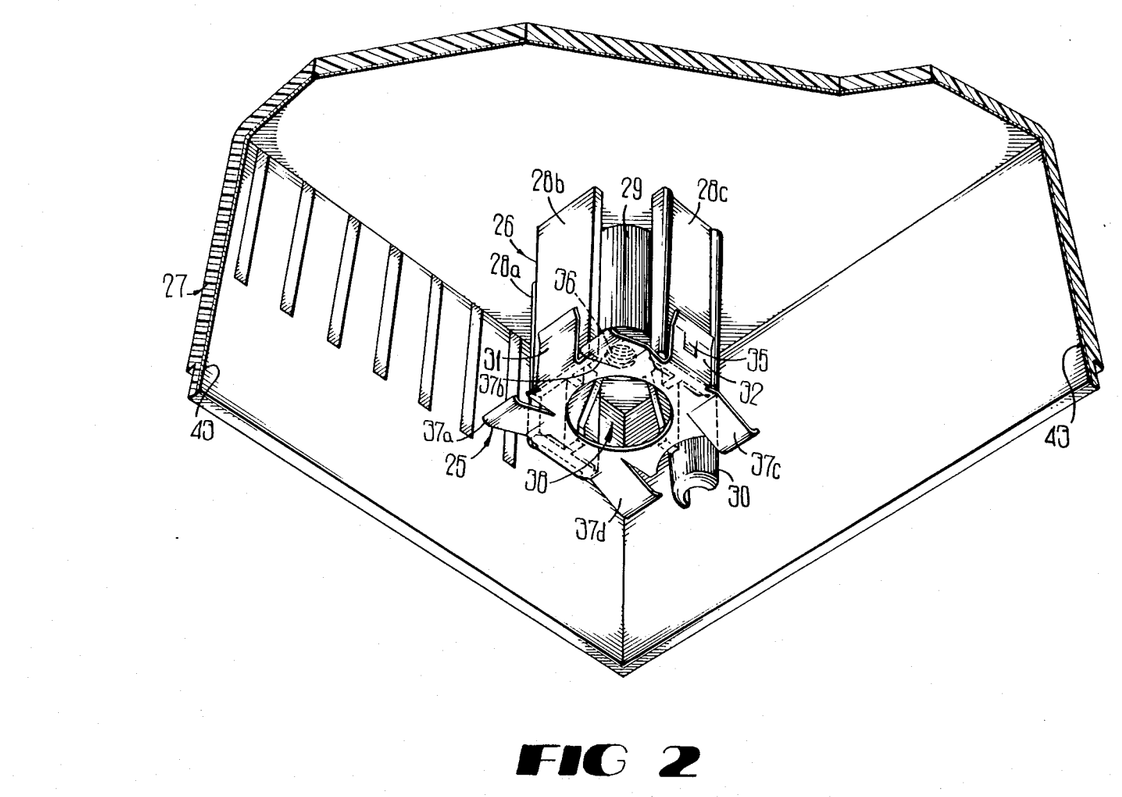
FIG. 2 is a pictorial view of the preferred embodiment of the grounding and spring clip attched to a mounting post on the equipment enclosure in the environment of the preferred embodiment.

FIG. 2 shows the improved grounding and spring clip of the preferred embodiment, generally indicated at 25, mounted on mounting post 26 in the top half 27 of the equipment enclosure of the preferred embodiment. The mounting post 26 has three side bars 28a through 28c, which are T-shaped in cross section and disposed about a circular central portion 29. On the side of post 26 not occupied by one of bars 28a through 28c is a locating pin 30 for fitting into a notch on the circuit board of the preferred embodiment for helping locate same properly. The T-shaped cross section of side bars 28a through 28c hidden lines is visible in FIG. 2. The flat surfaces of side bars 28a through 28c form surfaces to be gripped by three legs of spring clip 25, two of which are referenced as 31 and 32 and are visible in FIG. 2. It should be understood that the leg extended over side bar 28a is identical to leg 32. Each of these legs is bent inwardly and grips its associated side bar. Leg 32 includes a stamped tab, shown at 35, which bites into the surface of side bar 28c of mounting post 26.

As noted hereinabove, in the environment in which the preferred embodiment is used, the interior of the equipment enclosure, including the upper portion 27 shown in FIG. 2, is painted with copper containing conductive paint 43 to provide good RFI emission suppression. Tab 35 tends to bite into the coat of conductive paint 43, thus assuring good electrical contact between the paint covering mounting post 26 and spring and grounding clip 25.

It will also be appreciated that tab 35 provides a secure physical connection between grounding clip 25 and post 26 and that same will tend to bite further into the surface of post 26 if any attempt is made to withdraw same.

Naturally, the present invention has equal utility in an application in which the equipment enclosure is made entirely of electrically conductive metal.

Shown in hidden lines in the center of mounting post 26 is a threaded insert 36 for receiving the threaded end of a machine screw during final assembly of the apparatus. In the preferred embodiment, insert 36 is metallic, and is inserted into a hole molded into circular center portion 29 of mounting post 26 by ultrasonic methods well known to those skilled in the art.

A plurality of four leaf springs 37a through 37d are disposed about the periphery of the clip. These provide the mechanical resilience and spring action, discussed hereinabove, when the present invention is employed in an electronics assembly process. It will be appreciated from inspection of spring clip 25 that same is completely manufactured from stamped metal and thus may be made very inexpensively.

In the center of the spring clip is a large hole which provides an opening to a recessed area 38 above the top of circular portion 29 and interior to the volume defined by side bars 28. This area is sized so as to be sufficiently large to accept the complete set of flexible clips 21 from standoff 15 (FIG. 1) so that same will not be journaled against any of the apparatus shown in FIG. 2. Therefore, as will become apparent from the discussion of FIG. 4, leaf springs 37a through 37d will bear the load from the compression of the final assembly and none will be applied directly to flexible clips 21. This allows complete freedom of movement along the longitudinal axis of standoff 17 during tightening and loosening of the assembly screws.

Figure 3:
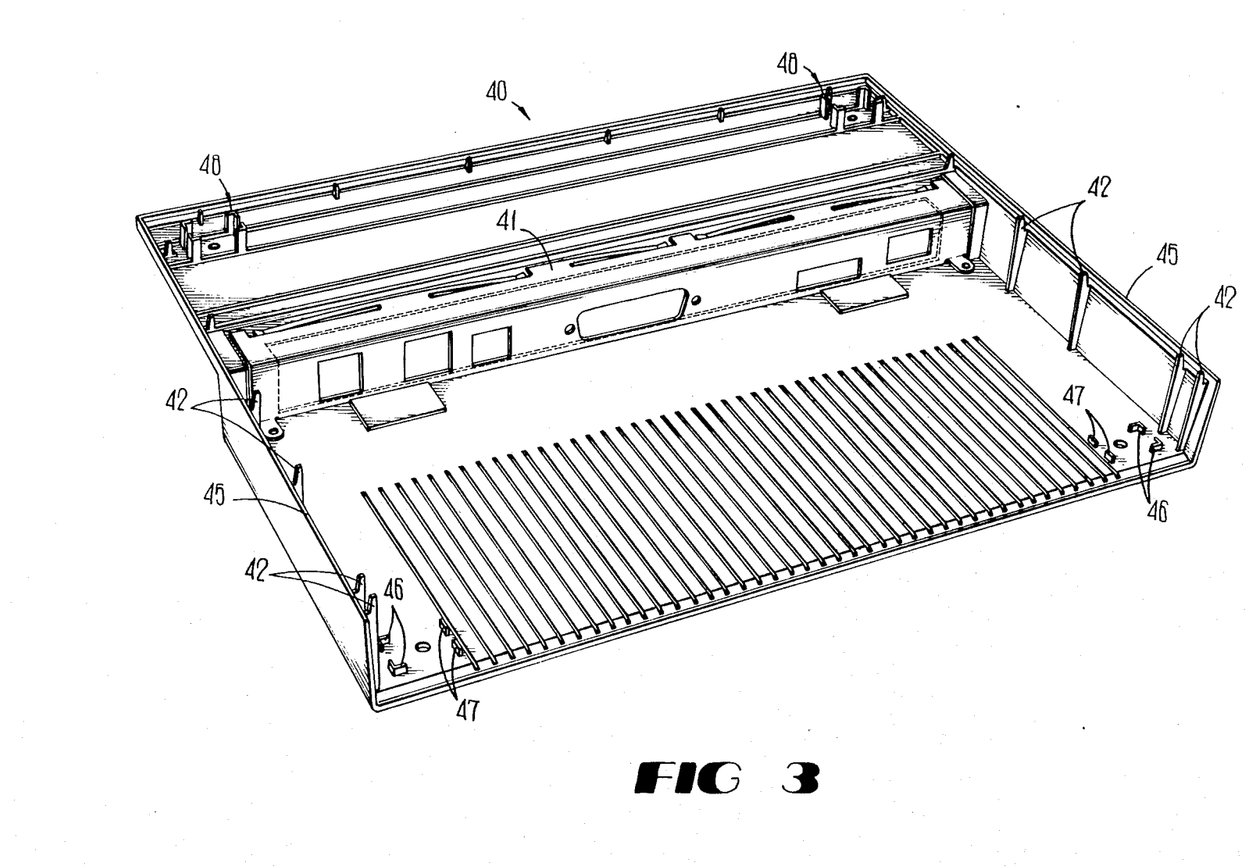
FIG. 3 is a pictorial view of the lower portion of an electronic equipment enclosure constituting an exemplary environment for the preferred embodiment.

Turning next to FIG. 3, a pictorial view of the bottom portion of the enclosure in which the preferred embodiment is used is shown. Generally, the bottom portion of the case is shown at 40. It has a metallic receptacle plate 41 mounted in an opening in the rear of the enclosure for holding a plurality of receptacles used in the modem constructed according to the preferred embodiment of the present invention. A plurality of retaining tabs 42 are disposed about the periphery and are used to give lateral support to the walls of the enclosure. It should be noted that the above-referenced reveal which is sought during final assembly will appear around the periphery of the upper edge 45 of lower case portion 40. A set of fixed angular standoffs 46 and corresponding linear standoffs 47 are shown in two corners of the lower enclosure portion 40. Additional standoffs at the rear of lower enclosure portion 40 are indicated generally at 48.

Standoffs 46 and 47 in the preferred embodiment are part of the molded structure of lower case portion 40 and have a height which is selected to provide sufficient clearance between the bottom of a circuit board and flexible clips 21 of standoff 15 (FIG. 1).

Figure 4:
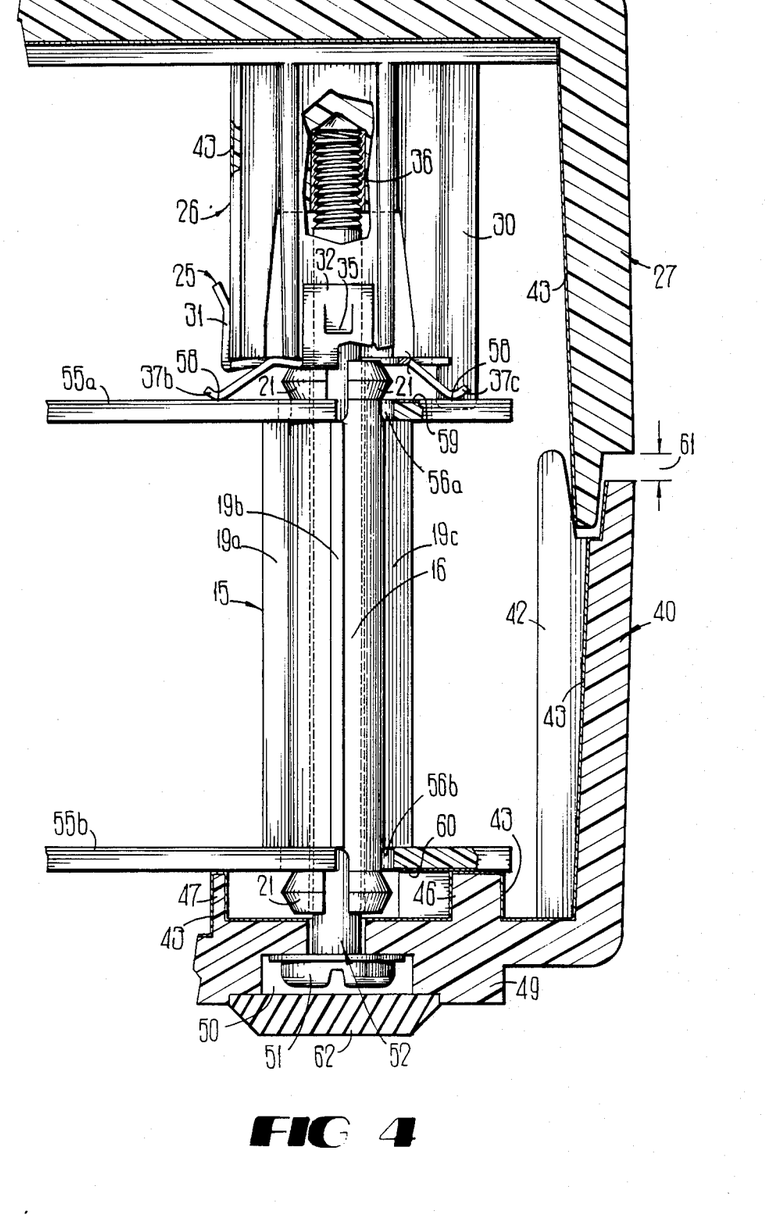
FIG. 4 is a section view of the overall assembly of mounting post, spring and grounding clip, and improved standoff in the preferred embodiment.

Turning next to FIG. 4, the ultimate use of the preferred embodiment in a finally assembled electronic apparatus is shown. In the preferred embodiment, legs are formed on the bottom of lower enclosure portion 40. These are formed directly under standoffs 47 and 46. A recess indicated at 50 is provided for receiving head 51 of a machine screw 52. This screw is threaded into insert 36 within mounting post 26.

A pair of circuit boards 55a and 55 b are used in this assembly. As is shown in phantom in FIG. 4, the distal end of locater tab 30 extends into a notch on circuit board 55a to assist in proper positioning of same. In assembling the apparatus, circuit boards 55a and 55b are first assembled by snapping them togethr by forcing flexible clips 21 through holes provided in the circuit boards, as shown, for example, at 56a and 56b in FIG. 4. First, it should be apparent that the subassembly of the two boards will then be held together by clips 21. While same will be loosely held together, this will prevent contact between, or separation of, the two circuit boards. Spring and grounding clip 25 is simply placed over mounting post 26. Next, screw 52 is inserted from the bottom in the interior of foot 49. The screw is passed through the longitudinal bore of standoff 15 until it contacts threaded insert 36 within the interior of mounting post 26. Tightening of the screw can then commence with the following results.

It should first be noted that the stress points in this assembly are between circuit board 55b, and standoffs 46 and 47. On the other surface of circuit board 55b, the reinforcing fins and the bottom shoulder of standoff 15 bear the load. Proceeding upwardly in the drawing, circuit board 55a is forced against the corresponding shoulder at the other end of standoff 15. As screw 52 is tightened, leaf springs 37a through 37d become bent under torsion and provide the necessary stress to assure that screw 52 remains properly mated with threaded portion 36.

Additionally, the desired reveal between lower enclosure portion 40 and upper enclosure portion 27 is indicated by dimension line 61 in the drawing. Given tolerances for the length of standoff 15, the height of mounting post 26, the height of standoffs 46 and 47, the thicknesses of circuit boards 55a and 55b, necessary adjustment to get the reveal 61 to its desired dimensin can be made by simply adjusting the distance between the cabinet portions by selective rotation of screw 52. The longitudinal difference in distance between enclosure portions 40 and 27 is taken up by movement of leaf springs 37a through 37d.

The locations 58 at which leaf springs 37a through 37d contact circuit board 55a carry wide foil conductors 59 connected to circuit ground. This is in keeping with good design practice of having large grounded foil areas around the periphery of the board. It will also be appreciated that, since spring and grounding clip 25 is made of electrically conductive metal, a secure ground is provided from the grounded foil 59 on the circuit board at locations 58 through leaf springs 37a through 37d and on to mounting post 26, which bears a coating of metalized paint 43. This serves to ground the board which is physically centered within the enclosure to the case ground. Grounding of circuit board 55b is accomplished through the contact of foil areas 60 with the coating of metallized paint 43 on standoffs 46 and 47, as well as other connectors to ground.

As a final finish, a rubber foot 62 is inserted over recess 50, and secured with some form of cement or glue, to provide a non-sliding rubber foot for the electronic device and also to hide head 51 of screw 52.

From inspection of FIG. 4, and the foregoing description, it will be apparent that leaf springs 37a through 37d will remain stressed during the life of the assembly. Thus, even if there is significant stress relaxation in the plastic components, such as mounting post 26, the metallic leaf springs 37a through 37d will continue to provide the appropriate force to keep the apparatus tightly assembled.

It should further be appreciated that disassembly of the apparatus, for example for purposes of repair, is easily accomplished and does not encounter the problems of prior art devices employing multiple circuit boards. If disassembly is ever required for repair or any other purpose, the screws are removed and at least one portion of the enclosure is lifted off. This will separate spring slips 25 from one end of standoffs 15. When any other appropriate devices connected to the circuit boards have been disconnected, the entire assembly including circuit boards 55a and 55b may be lifted out simply by grabbing one of the boards, for example, board 55a. Thus, the entire assembly will be held together without encountering the prior art problems of instantaneous and unintentional disassembly of a plurality of spacers and screws which must then be collected from the interior of the enclosure or the work table.

Also, if any jumper cables or the like are provided between circuit boards 55a and 55b, employment of the standoff of the present invention avoids the usual problem of undue physical stress on the interconnecting wires. Those skilled in the art will understand that this often arises when, during the process of assembly or disassembly, an attempt is made to move one of the boards. This normally results in movement of the board being manipulated until the point at which the slack on any such connectors (usually jumper wires, ribbon cables, or the like) runs out, in which case the second board starts to be lifted, solely through the physical devices constituting the inner board connection. This can lead to broken leads and solder joints which require additional repair.

By employment of the standoff of the present invention, a multi-board assembly may be held together dependably and such problems will not arise. Additionally, it will be seen that the board real estate required for screw holes for mechanical assembly is not duplicated. For example, in the prior art, it is known to provide multiple conventional standoffs in a multi-circuit board assembly for holding the boards together at predetermined spacings and then to provide additional standoffs to position the multiboard assembly within an enclosure. The functions of retaining the boards in a physically joined fashion, as well as providing a hole through which a final assembly screw may be passed, is achieved by employment of the present invention.

From the foregoing, it will be appreciated that the present invention overcomes the drawbacks of the prior art and accomplishes the objects of the invention stated hereinabove. In light of the disclosure of the preferred embodiment, other embodiments of the present invention will suggest themselves to those skilled in the art. Therefore, the scope of the present invention is to be limited only by the claims below.

What is claimed is:

1. A standoff for use in constructing electronic equipment, comprising:
    an elongated shank characterized by a longitudinal axis;
    means defining a bore completely through said shank, said bore being centered on said longitudinal axis;
    at least three elongated reenforcing fin members disposed on the periphery of said shank and extending parallel to said longitudinal axis, each of said fin members terminating at first and second ends of said shank in first and second planes perpendicular to said longitudinal axis; and a plurality of flexible snap clips located at said first end of said shank and extending above said first plane perpendicular to said longitudinal axis for holding a circuit board seated on the ends of said fin members parallel to said first plane perpendicular to said longitudinal axis.

2. A standoff as recited in claim 1 wherein:
said plurality of flexible snap clips is a first plurality of flexible snap clips, said circuit board is a first circuit board, and further comprising:
a second plurality of flexible snap clips extending below said second plane perpendicular to said longitudinal axis for holding a second circuit board seated on said second ends of said fin members parallel to said first plane perpendicular to said longitudinal axis.

3. A standoff as recited in claim 2 wherein:
said second plurality of flexible snap clips includes four of said flexible snap clips.

4. A standoff as recited in claim 2 wherein:
said standoff is of unitary construction and made of 6—6 nylon.

5. A standoff as recited in claim 1 wherein:
four of said elongated reenforcing fin members are disposed on the periphery of said shank.

6. A standoff as recited in claim 1 wherein:
said plurality of flexible snap clips includes four of said flexible snap clips.

7. A standoff as recited in claim 1 wherein:
said standoff is of unitary construction and made of 6—6 nylon.

8. A grounding and spring clip for use in constructing an electronic device of the type having at least one circuit board within an equipment enclosure having RFI suppressing shielding therein, comprising:
a substantially planar surface;
means defining a hole through said substantially planar surface for allowing a bolt to pass therethrough;
a plurality of extending legs for fitting over and maintaining contact with an electrically conductive portion of a mounting post, said mounting post being connected to said RFI suppressing shielding, and at least one of said extending legs including means for scoring and gripping said electrically conductive portion of said mounting post; and
at least one extending electrically conductive leaf spring, at least one said leaf spring being electrically connected to at least one of said extending legs and extending in a direction opposite of said extending legs.

9. A grounding and spring clip for use in constructing an electronic device of the type having at least one circuit board within an equipment enclosure having RFI suppressing shielding therein, comprising:
a planar surface;
means defining a hole through said planar surface for allowing a bolt to pass therethrough;
a plurality of extending legs disposed on the periphery of said planar surface for fitting over and maintaining contact with an electrically conductive portion of a mounting post, said mounting post being connected to said RFI suppressing shielding, and at least one of said extending legs including means for scoring and gripping said electrically conductive portion of said mounting post; and
at least four extending, electrically conductive leaf springs, said leaf springs being electrically connected to said extending legs and extending in a direction opposite of said extending legs.

10. Apparatus for use in constructing an electronic device of the type having at least one circuit board with at least one mounting hole provided therethrough within an equipment enclosure having RFI suppressing shielding therein, comprising:
a mounting post secured to at least one portion of said equipment enclosure, said mounting post having at least one electrically conductive portion thereof electrically connected to said RFI suppressing shielding, said mounting post having a mounting post bore through a characteristic post longitudinal axis;
a standoff having an elongated shank characterized by a standoff longitudinal axis;
means defining a standoff bore completely through said shank, said standoff bore being centered on said standoff longitudinal axis;
at least three elongated reenforcing fin members disposed on the periphery of said shank and extending parallel to said standoff longitudinal axis, each of said fin members terminating at first and second ends of said shank in first and second planes perpendicular to said standoff longitudinal axis;
a plurality of flexible snap clips located at said first end of said shank and extending above said first plane perpendicular to said standoff longitudinal axis for holding said circuit board seated on the ends of said fin members parallel to said first plane perpendicular to said standoff longitudinal axis;
a grounding clip including a substantially planar surface;
means defining a hole through said substantially planar surface for allowing said plurality of flexible snap clips to pass therethrough;
a plurality of extending legs for fitting over and maintaining contact with said electrically conductive portion of said mounting post; and
at least one extending, electrically conductive, leaf spring for contacting a grounded foil area on said circuit board proximate said mounting hold, at least one said leaf spring being electrically connected to at least one of said extending legs and extending in a direction opposite of said extending legs.

11. Apparatus as recited in claim 10 further comprising:
a recess in said mounting post, substantially centered on said post longitudinal axis for receiving said plurality of flexible snap clips in nonjournaled relationship.

12. Apparatus for use in constructing an electronic device of the type having at least one circuit board with at least one mounting hole provided therethrough within an equipment enclosure having RFI suppressing shielding therein, comprising:
a mounting post secured to at least one portion of said equipment enclosure, said mounting post having at least one electrically conductive portion thereof electrically connected to said RFI suppressing shielding, said mounting post having a characteristic post longitudinal axis;
a standoff having an elongated shank characterized by a standoff longitudinal axis;
means defining first and second land areas in planes perpendicular to said standoff longitudinal axis at first and second ends of said shank;

a plurality of flexible snap clips located at said first end of said shank and extending above said first plane perpendicular to said standoff longitudinal axis, said plurality of snap clips being radially inward of at least a portion of the periphery of said first land area with respect to said standoff longitudinal axis;

a grounding clip including a substantially planar surface;

means defining a hole through said substantially planar surface for allowing said plurality of flexible snap clips to pass therethrough;

a plurality of extending legs for fitting over and maintaining contact with said electrically conductive ortion of said mounting post; and at least one extending, electrically conductive, leaf spring for contacting a grounded foil area on said circuit board proximate said mounting hole, at least one said leaf spring being electrically connected to at least one of said extending legs and extending in a direction opposite of said extending legs.

* * * * *